United States Patent
Schmidt

(10) Patent No.: US 7,501,807 B2
(45) Date of Patent: Mar. 10, 2009

(54) SPECTRUM ANALYZER HAVING A RESOLUTION FILTER THAT CAN BE ADJUSTED VIA PHASE-VARIATION PARAMETER

(75) Inventor: Kurt Schmidt, Grafing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 192 days.

(21) Appl. No.: 10/580,162

(22) PCT Filed: Nov. 11, 2004

(86) PCT No.: PCT/EP2004/012809

§ 371 (c)(1),
(2), (4) Date: Feb. 26, 2007

(87) PCT Pub. No.: WO2005/050841

PCT Pub. Date: Jun. 2, 2005

(65) Prior Publication Data

US 2007/0222431 A1    Sep. 27, 2007

(30) Foreign Application Priority Data

Nov. 19, 2003  (DE) ................. 103 53 958

(51) Int. Cl.
*G01R 23/00* (2006.01)
*G01R 13/24* (2006.01)
*G01R 23/165* (2006.01)

(52) U.S. Cl. ............. 324/76.19; 324/76.27; 324/76.29
(58) Field of Classification Search ........... 324/76.19, 324/76.27, 76.29
See application file for complete search history.

(56) References Cited

U.S. PATENT DOCUMENTS

| 5,736,845 | A | 4/1998 | Kosuge |
| 6,275,020 | B1 | 8/2001 | Nagano |
| 6,445,327 | B1 | 9/2002 | Kishi |
| 6,763,323 | B2 * | 7/2004 | Schmidt ............ 702/190 |

FOREIGN PATENT DOCUMENTS

| DE | 199 22 249 | 1/2000 |
| DE | 101 05 258 | 8/2002 |
| WO | PCT/EP2004/012809 | 10/2006 |

* cited by examiner

*Primary Examiner*—Diego Gutierrez
*Assistant Examiner*—Amy He
(74) *Attorney, Agent, or Firm*—Ditthavong Mori & Steiner, P.C.

(57) ABSTRACT

A spectrum analyzer is described which comprises a mixer for mixing the conjugate complex input signal v*(t) into a base band signal x(t), and a resolution filter for narrow-band filtering the base band signal. The resolution filter has a complex, discrete impulse response using a variation parameter $k_0$ set to compensate for the frequency overshoot determined by the group delay of the resolution filter.

9 Claims, 3 Drawing Sheets

SPECTRUM ANALYZER HAVING A RESOLUTION FILTER THAT CAN BE ADJUSTED VIA PHASE-VARIATION PARAMETER

FIELD OF THE INVENTION

The invention relates to a resolution filter for a spectrum analyser.

BACKGROUND OF THE INVENTION

In spectrum analysis, a specified frequency range is "swept" with a resolution filter with a specified bandwidth. The resolution filter is therefore also sometimes referred to as a sweep filter. A resolution filter of this kind for a spectrum analyser with an analogous structure is known, for example, from U.S. Pat. No. 5,736,845. With resolution filters of the known, analogous structure, only a limited sweep rate can be achieved; the so-called K-factor, which indicates the rate of sweep, is limited in resolution filters of the known structure.

It has been assumed hitherto in the context of spectrum analysis that it is possible to sweep within a $T_{res}$ in the order of magnitude around $1/B_{res}=T_{res}$, so that the resolution filter can still build up. However, this statement is only correct if a fixed filter is assumed for all the sweep rates.

A digital resolution filter for a spectrum analyser is known from DE 101 05 258 A1. The resolution filter described in this context is characterised by a Gaussian impulse response. It is a so-called linear-phase resolution filter. Linear-phase resolution filters have a relatively long group delay response. As a result, during sweeping, these filters have a considerable frequency overshoot, and the middle of the spectrum is no longer disposed at the frequency origin. A degree of design freedom, which would allow a compensation of these undesirable effects is not provided with the impulse response of the resolution filter defined in DE 101 05 258 A1.

SUMMARY OF THE INVENTION

A need therefore exists for providing a spectrum analyser and an associated resolution filter, wherein the impulse response of the resolution filter has a free design parameter, which allows a compensation of the frequency overshoot, the displacement of the frequency origin and other undesirable effects.

According to an embodiment of the invention, the free variation parameter $k_0$ is introduced into the phase factor of the impulse response. This free variation parameter represents a degree of freedom of the phase in the design of the filter. Accordingly, for example, not only linear-phase, but also minimal-phase filters can be realised in an efficient manner.

The free variation parameter $k_0$ can preferably be set in such a manner that the frequency overshoot determined by the group delay of the resolution filter is compensated.

As an alternative or at the same time, the variation parameter $k_0$ can also be set in such a manner, that the middle of the frequency response of the resolution filter is disposed at the frequency origin, that is to say, at the frequency f=0.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The invention will be explained in greater detail below with reference to the drawings. The drawings are as follows.

DETAILED DESCRIPTION OF THE PREFERRED EMBODIMENT

Figure 1:
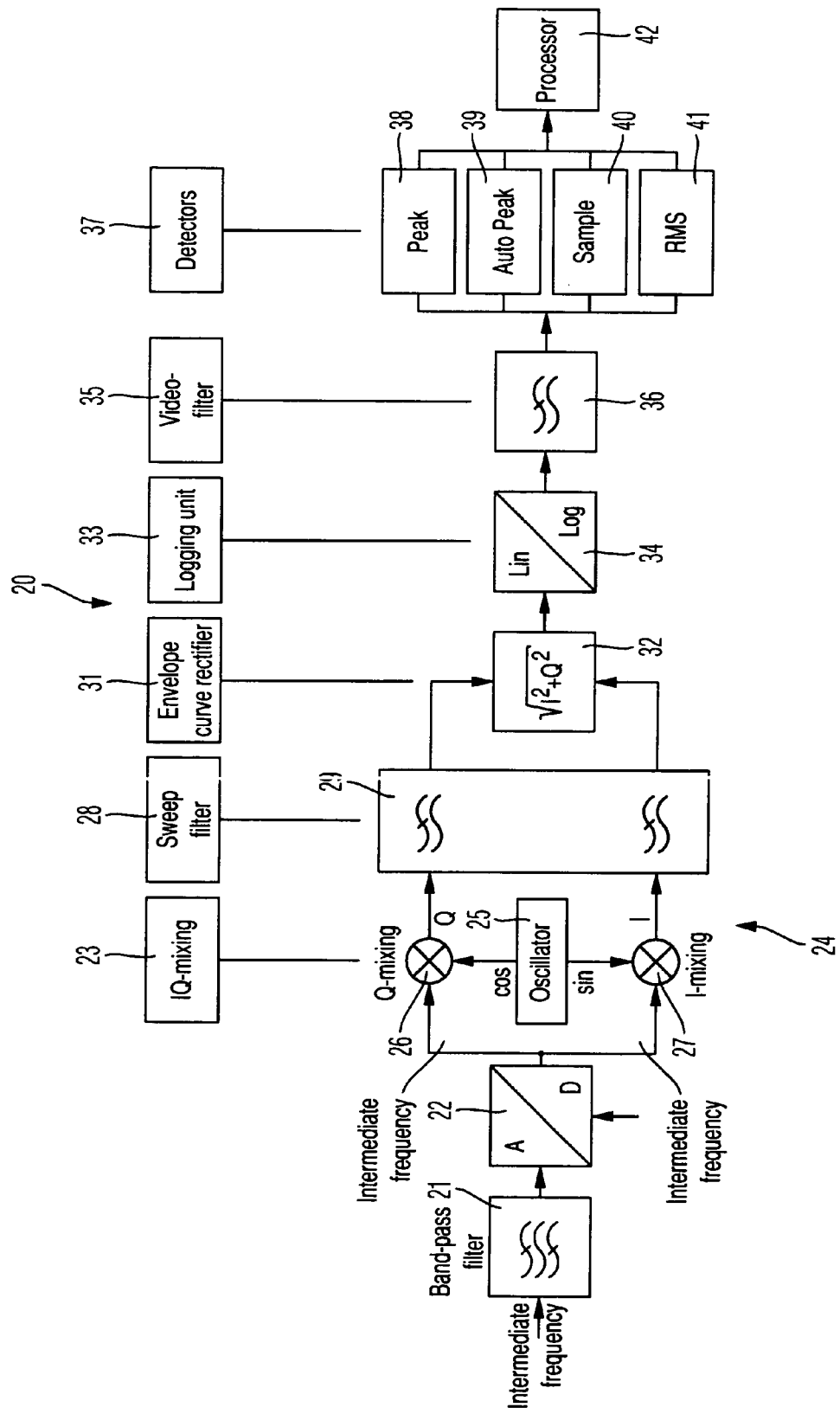
FIG. 1 shows a block circuit diagram of a spectrum analyser, in which the resolution filter according to the invention can be used.

FIG. 1 provides an overview of a spectrum analyser 20, in which the resolution filter 29 according to the invention is used. FIG. 1 shows only the region of the signal below the intermediate frequency level, which is relevant here.

The intermediate frequency signal marked ZF in the drawings is filtered in a band-pass filter 21. The band-pass filter 21 is connected to an analog/digital converter 22. This is followed by the I/Q mixing 23 in an I/Q demodulator 24, which, in the conventional manner, comprises a local oscillator 25 with two outputs phase-displaced through 90°, which are supplied, together with the filtered and A/D-converted intermediate frequency signals, to a mixer 27 of the I-branch and a mixer 26 of the Q-branch respectively.

This stage is followed by a digital filtering 28 with the resolution filter 29 according to the invention. An envelope-curve rectification 31 then takes place in an envelope-curve rectifier 32. Logging 33 is implemented in a logging unit 34. The logging unit 34 is connected to a video filter 36, in which a video filtering 35 is implemented.

Various detectors 38 to 41, for example, a peak detector 38, an auto peak detector 39, a sample detector 40 and an RMS (Route Mean Square) detector may be provided in the detection stage 37. Depending on the requirements, either all four detectors can be incorporated in a high-performance spectrum analyser 20, or only specific detectors, for example, only a single detector for specialised measuring tasks, needs to be installed. Evaluation and control are implemented via a microprocessor 42.

Figure 2:
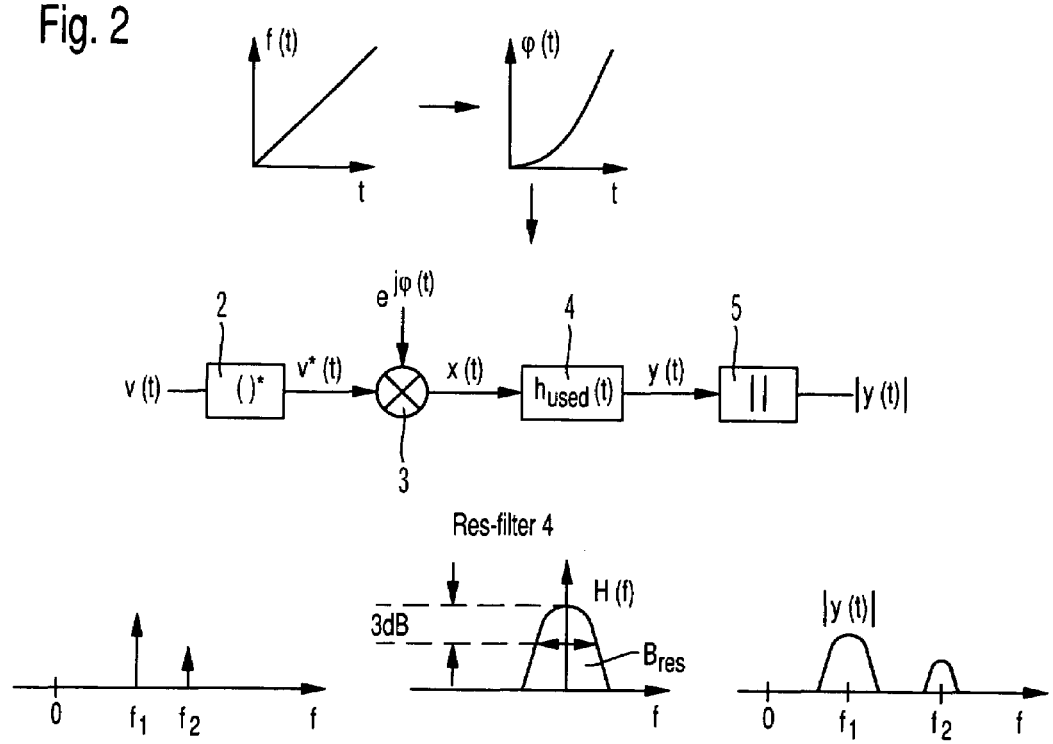
FIG. 2 shows a block circuit diagram of the spectrum analysis in the equivalent baseband.

FIG. 2 shows a simplified block circuit diagram of blocks 24, 29 and 32 of the spectrum analyser 20 from FIG. 1. The complex input signal v(t) to be analysed is supplied to a complex-conjugate former 2, which forms the complex-conjugate signal v*(t) of the input signal v(t). The complex-conjugate input signal v*(t) is mixed down into the baseband signal x(t) in a mixer 3 by multiplication with the sweep signal $e^{j\phi(t)}$. The frequency f(t) of the sweep signal is shown at the top of FIG. 2 as a function of time t, wherein it can be seen, that the sweep frequency f(t) changes in a linear manner with time. The phase angle $\phi(t)$ as a function of time t is obtained by integration. The baseband signal x(t) is supplied to the resolution filter 4 according to the invention. In the resolution filter 4, the baseband signal x(t) is convoluted with the impulse response $h_{used}(t)$ of the resolution filter 4. This leads to the output signal y(t). The modulus |y(t)| of the signal y(t) is formed in a modulus former 5.

The lower region of FIG. 2 shows by way of example an input signal v(t), of which the spectrum consists of two discrete spectral lines. An example of the transmission function H(t) of the resolution filter 4 is also shown. The spectrum shown to the right of this is displayed at the output of the spectrum analyser 1, wherein the spectral lines are widened by the resolution bandwidth $B_{res}$ of the resolution filter 4. The resolution bandwidth $B_{res}$ corresponds to the bandwidth with an attenuation by −3 dB relative to the maximum.

By way of further explanation of the invention, the deliberations from document DE 101 05 258 A1, which lead to a resolution filter with a given impulse response, are briefly presented again below.

The spectrum of the signal v(t) is initially windowed with the impulse response of the resolution filter, and following this, the Fourier transform is implemented according to the following equation:

$$S(f) = \int_{-\infty}^{\infty} v(\tau) h_{res}(\tau) \cdot e^{-j\omega\tau} d\tau = H_{res}(f) * V(f). \qquad (1)$$

The question of the correlation of the spectrum with white noise is relevant in this context. This correlation describes the distance, at which the spectrum is un-correlated. The ACF (auto-correlation function) of the input signal with white noise is described by the following equation:

$$E\{v(\tau) v * (\tau + dt)\} = \underset{real/imag}{2} \cdot N_0 / 2\delta(dt). \qquad (2)$$

The ACF of the Fourier spectrum is obtained using equation (1).

$$E\{S^*(f) \cdot S(f+df)\} = E\left\{ \begin{array}{l} \int_{-\infty}^{\infty} v^*(\tau_1) h_{res}^*(\tau_1) \cdot e^{j\omega\tau_1} d\tau_1 \cdot \\ \int_{-\infty}^{\infty} v(\tau_2) h_{res}(\tau_2) \cdot e^{-j(\omega+d\omega)\tau_2} d\tau_2 \end{array} \right\}$$

$$= \int_{-\infty}^{\infty}\int_{-\infty}^{\infty} E\{v^*(\tau_1) \cdot v(\tau_2)\} h_{res}^*(\tau_1) \cdot h_{res}(\tau_2) e^{-j\omega(\tau_1 - \tau_2)} e^{-jd\omega\tau_2} d\tau_1 d\tau_2$$

Substitution of equation (2) with $\tau_1 = \tau_2 := \tau$ leads to the following equations:

$$E\{S^*(f) \cdot S(f+df)\} = \int_{-\infty}^{\infty} N_0 h_{res}^*(\tau) \cdot h_{res}(\tau) e^{-jd\omega\tau} d\tau$$

$$= N_0 \int_{-\infty}^{\infty} |h_{res}(\tau)|^2 \cdot e^{-jd\omega\tau} d\tau$$

$$= N_0 \cdot F\{|h_{res}(\tau)|^2\}$$

For a Gaussian filter, the following applies:

$$h_{gauss}(t) = \sqrt{\frac{\pi}{2\ln(2)}} B_{res} \cdot e^{-\frac{\pi^2}{2\ln(2)}\left(\frac{t}{T_{res}}\right)^2} \qquad (3)$$

$$H_{gauss}(f) = e^{-2\ln(2)\left(\frac{f}{B_{res}}\right)^2}.$$

The equations below follow from equation (3):

$$\begin{aligned} R_h(\tau) &= F^{-1}\{|H_{gauss}(f)|^2\} \qquad (4) \\ &= F^{-1}\{e^{-2\ln(2)\cdot 2\left(\frac{f}{B'_{res}}\right)^2}\} \text{ with } B'_{res} = B_{res}/\sqrt{2} \\ &= \sqrt{\frac{\pi}{2\ln(2)}} \cdot B'_{res} \cdot e^{-\frac{\pi^2}{2\ln(2)}\left(\frac{\tau}{T'_{res}}\right)^2} \text{ with } T'_{res} = T_{res}\sqrt{2} \\ &= \underbrace{\sqrt{\frac{\pi}{2\ln(2)}} \cdot B_{res}/\sqrt{2}}_{:=B_{noise}} \cdot e^{-\frac{\pi^2}{2\ln(2)}\left(\frac{\tau}{\sqrt{2}\cdot T_{res}}\right)^2}. \end{aligned}$$

Moreover, with equation (4), the equations below follow:

$$\begin{aligned} F\{|h_{gauss}(t)|^2\} &= F\left\{\frac{\pi}{2\ln(2)} B_{res}^2 e^{-\frac{\pi^2}{2\ln(2)}\cdot 2\left(\frac{\tau}{T_{res}}\right)^2}\right\} \text{ with } T'_{res} = T_{res}/\sqrt{2} \qquad (5) \\ &= \frac{\frac{\pi}{2\ln(2)} B_{res}^2}{\left(\frac{\pi}{2\ln(2)}\right)^{1/2} B'_{res}} \cdot e^{-2\ln(2)\left(\frac{f}{B'_{res}}\right)^2} \text{ with } B'_{res} = B_{res}\sqrt{2} \\ &= \underbrace{\sqrt{\frac{\pi}{2\ln(2)}} B_{res}/\sqrt{2}}_{B_{noise}} \cdot e^{-\ln(2)\left(\frac{f}{B_{res}}\right)^2}. \end{aligned}$$

With a Gaussian resolution filter, the equation below is obtained using equation (5):

$$E\{S^*(f) \cdot S(f+df)\} = N_0 \cdot B_{noise} \cdot e^{-\ln(2)\left(\frac{df}{B_{res}}\right)^2}. \qquad (6)$$

FIG. 2 shows a block circuit diagram of a spectrum analysis in the equivalent baseband. It should be borne in mind that the HF-signal v(t) to be investigated is observed in the equivalent baseband in order to allow a simpler model (i.e. without spectral components at f<0). After the formation of v*(t), the signal is multiplied by the rotary phasor $e^{j\Phi(t)}$ leading to the following equation:

$$x(t) = v^*(t) \cdot e^{j\Phi(t)} \qquad (7)$$

The frequency of the rotary phasor increases in a linear manner with time according to the following equation:

$$f(t) = \frac{1}{K} \cdot B_{res}^2 \cdot t. \qquad (8)$$

The K-factor indicates the sweep rate. Since the resolution filter requires a transient time of approximately $T_{res}$, the frequency should change by a maximum of $B_{res}$ within $T_{res}$, which, according to equation (8), corresponds to a maximum k-factor of k=1. The following phase is obtained by integration:

$$\varphi(t) = \int_{-\infty}^{t} 2\pi f(t) dt = \frac{\pi}{K} \cdot B_{res}^2 \cdot t^2. \qquad (9)$$

The signal x(t) is then filtered through the resolution filter with the impulse response $h_{used}(t)$ producing the output signal $y(t)$. The envelope curve $|y(t)|$ is determined from this output signal, and then displayed on the spectrum analyser, generally in a logarithmic format.

The output signal is obtained from the following equation:

$$y(t) = x(t)^* h_{used}(t) = \int_{-\infty}^{\infty} h_{used}(\tau) \cdot x(t-\tau) d\tau$$

Introducing equation (7) leads to the following equation:

$$y(t) = \int_{-\infty}^{\infty} h_{used}(\tau) \cdot v^*(t-\tau) e^{j\varphi(t-\tau)} d\tau$$

Introducing equation (9) finally leads to the following equation:

$$y(t) = \int_{-\infty}^{\infty} h_{used}(\tau) \cdot v^*(t-\tau) e^{j\frac{\pi}{K} \cdot B_{res}^2 \cdot (t-\tau)^2} d\tau$$

The following equation is obtained by multiplying out:

$$y(t) = \frac{e^{j\frac{\pi}{K} \cdot B_{res}^2 \cdot t^2}}{e^{j\varphi(t)}} \int_{-\infty}^{\infty} \underbrace{h_{used}(\tau) e^{j\frac{\pi}{K} \cdot B_{res}^2 \cdot \tau^2}}_{h_{disp}(\tau)} \cdot v^*(t-\tau) e^{-j\frac{2\pi}{K} \cdot B_{res}^2 \cdot t\tau} d\tau, \quad (10)$$

wherein the first term $e^{j\Phi(t)}$ is not problematic, because ultimately $|y(t)|$ will be displayed. The impulse response:

$$h_{disp}(t) = h_{used}(t) \cdot e^{j\frac{\pi}{K} \cdot B_{res}^2 \cdot t^2} \quad (11)$$

is introduced into the equation. The index "disp" denotes "displayed", because the spectrum of this impulse response is displayed, as will be shown below.

According to equation (8), the following equation is obtained by conversion:

$$t = \frac{f(t) \cdot K}{B_{res}^2}. \quad (12)$$

The following equation is obtained by substitution into equation (10):

$$y(t) = e^{j\varphi(t)} \int_{-\infty}^{\infty} h_{disp}(\tau) \cdot v*(t-\tau) e^{-j\omega(t)\cdot\tau} d\tau. \quad (13)$$

Now, some interesting statements can be made: comparing equation (13) with the Fourier analysis in equation (1) shows that 1. The "displayed" resolution filter $h_{disp}(t)$ described according to equation (11) rather than the used resolution filter $h_{used}(t)$ is displayed in the spectrum analysis. With a slow sweep for approximately $k \geq 2$, $h_{used}(t)$ and $h_{disp}(t)$ are approximately in agreement. However, with a faster sweep, significant differences occur. In this case, the level collapses, and the displayed resolution filter becomes broader (the filter can no longer build up).

2. In equation (13), by contrast with the Fourier analysis, the time signal displaced by t is used rather than $v(\tau)$. As a result, the spectrum analyser evaluates an observation interval sliding over time, which is not in itself problematic. However, the question regarding the influence of the rate of the sliding observation window on the output spectrum is particularly relevant.

In order to evaluate the question of the sliding observation window in point 2 in an improved manner, it is advisable to apply the Parseval's theorem, as set out below, to equation (13):

$$\int_{-\infty}^{\infty} x_1(\tau) \cdot x_2^*(\tau) d\tau = \int_{-\infty}^{\infty} X_1(F) \cdot X_2^*(F) dF$$

By substitution of:

$$x_1(\tau) = h_{disp}(\tau) \cdot e^{-j\omega(t)\tau} \xrightarrow{\tau} X_1(F) = H_{disp}(F + f(t))$$

$$x_2(\tau) = v(t-\tau) \xrightarrow{\tau} X_2(F) = V(-F) \cdot e^{j2\pi F t}$$

equation (13) can be described by the following equations:

$$y(t) = e^{j\varphi(t)} \int_{-\infty}^{\infty} H_{disp}(F + f(t)) \cdot V^*(-F) e^{-j2\pi F t} dF \quad (14)$$

$$= e^{j\varphi(t)} \int_{-\infty}^{\infty} H_{disp}(F - f(t)) \cdot V^*(F) e^{-j2\pi F t} dF.$$

Accordingly, as anticipated, a convolution of the input spectrum with the resolution filter is obtained according to the following equation:

$$y(t) = e^{j\Phi(t)} H_{disp}(f(t))^* [V^*(f(t)) e^{-j2\pi f(t) t}]$$

By inserting equation (12) into equation (14), the following equation is finally obtained:

$$y(t) = e^{j\varphi(t)} \int_{-\infty}^{\infty} H_{disp}(F - f(t)) \cdot V*(F) e^{-j\frac{2\pi K}{B_{res}^2} F f(t)} dF. \quad (15)$$

DE 101 05 258 A1 derives only a sweep-optimised Gaussian filter. This sweep-optimised Gaussian filter must be a linear-phase filter.

New insights have shown that the sweep-optimised filter can be derived for a random filter. The given filter can be random both with regard to its magnitude and also with regard to phase. It is particularly relevant that no restrictions are placed on phase. In the case of the sweep filter known from DE 101 05 258 A1, this degree of freedom could not be exploited, because the linear-phase properties were required in that context. With a randomly-specifiable phase, minimal-phase filters can now be realised according to the invention, which are optimised with regard to the necessary transient time.

Equation (10) defines the "displayed" impulse response $h_{disp}(t)$ and the "used" impulse response $h_{used}(t)$. In this context, the impulse response $h_{disp}(t)$ describes the transform of the frequency response $H_{disp}(f)$ of the resolution filter displayed in the sweep, while the impulse response $h_{used}(t)$ is the transform of the used filter with the frequency response $H_{used}(f)$. The correlation between the two impulse responses:

$$h_{disp}(t) = h_{used}(t) \cdot e^{j\frac{\pi}{K}B_{res}^2 t^2}$$

is already known from equation (11). Now, the procedure according to the invention consists in developing the frequency response of the displayed filter $H_{disp}(f)$ rather than the frequency response $H_{used}(f)$ of the used filter. Since only the modulus frequency response is displayed in spectrum analysis, the phase can be selected at random. According to this design, the impulse response $h_{disp}(t)$ is calculated by re-transformation. In the next stage, the sought impulse response $h_{used}(t)$ of the sweep-optimised filter is calculated according to the above formula with the sweep rate k.

The individual design stages are described in greater detail below:

1. Specification of the desired displayed modulus frequency response $|H_{disp}(f)|$:

A Gaussian filter is often used. However, filters with a less steeply-declining modulus frequency response can also be of interest, because this can reduce the group delay response. This is associated with a shorter transient time, which is particularly desirable in the case of applications with frequent transient processes of the filter.

2. Specification of the phase of $H_{disp}(f)$:

In principle, the phase can be specified randomly. In order to achieve a minimal group delay response, it is advisable to use a minimal-phase filter. Details of the design are given below. In this context, it is assumed that the filter is realised as a digital filter, that is to say, the discrete impulse response $h_{disp}(k)$ with $k=[0, \text{nof}_{Taps}-1]$ is calculated, wherein $\text{nof}_{Taps}$ describes the number of taps.

The simplest case is a design of a linear-phase filter with a length $\text{nof}_{Taps}$ with a specified modulus frequency response $|H_{disp}(f)|$. Currently available methods include the Remez algorithm and the MMS algorithm. Following this, the zero positions of the transmission function in the complex z-plane are determined. The zero positions outside the circle of radius 1 are then reflected into the circle of radius 1, so that the modulus frequency response remains unchanged. This method is sub-optimum, because it always leads to minimal-phase filters with doubled zero positions, which limits the degree of freedom.

Figure 3:
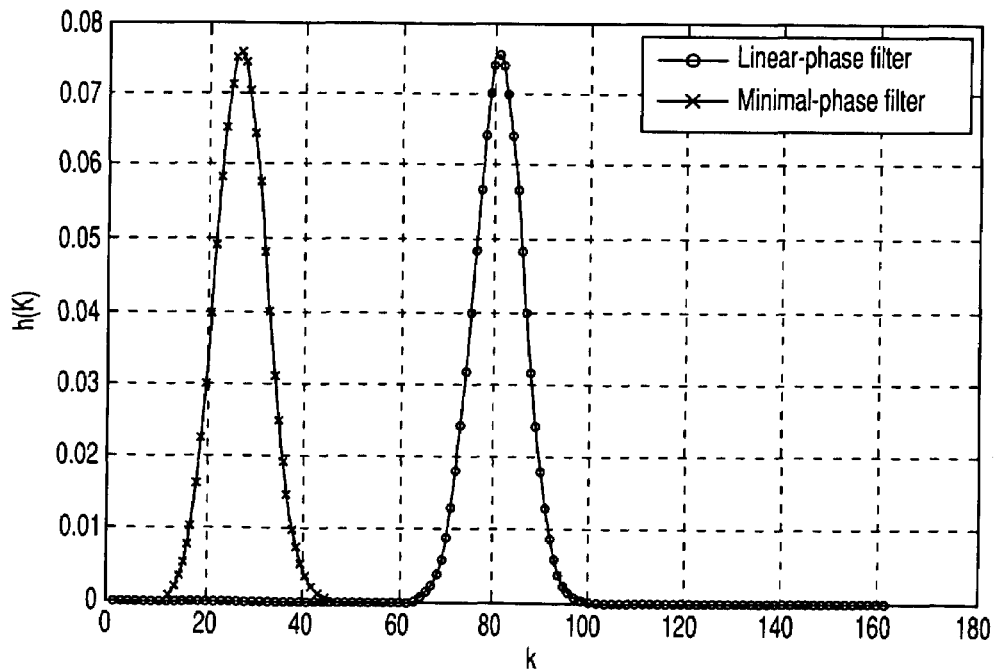
FIG. 3 shows the impulse response of a linear-phase filter and of a minimal-phase Gaussian filter.
Figure 4:
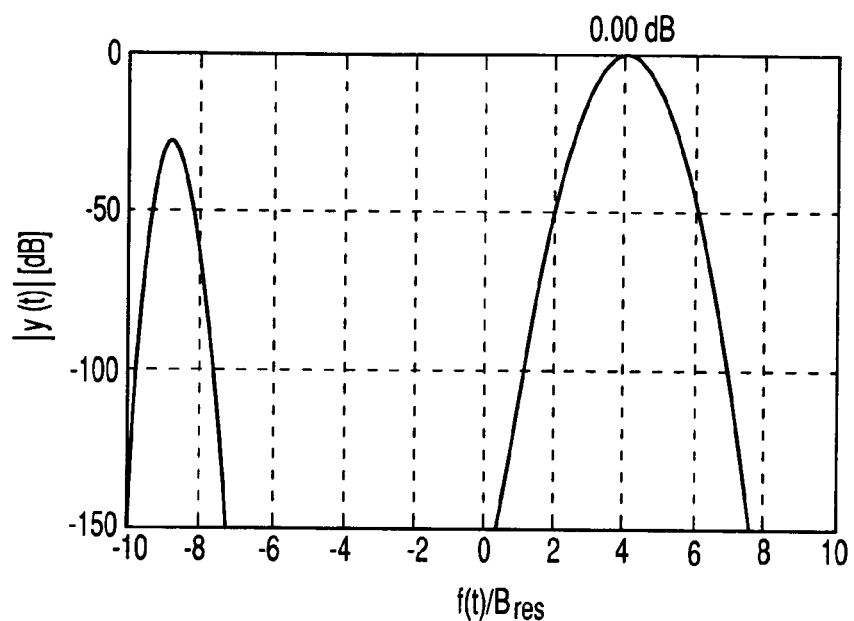
FIG. 4 shows a sweep with a minimal-phase filter.
Figure 5:
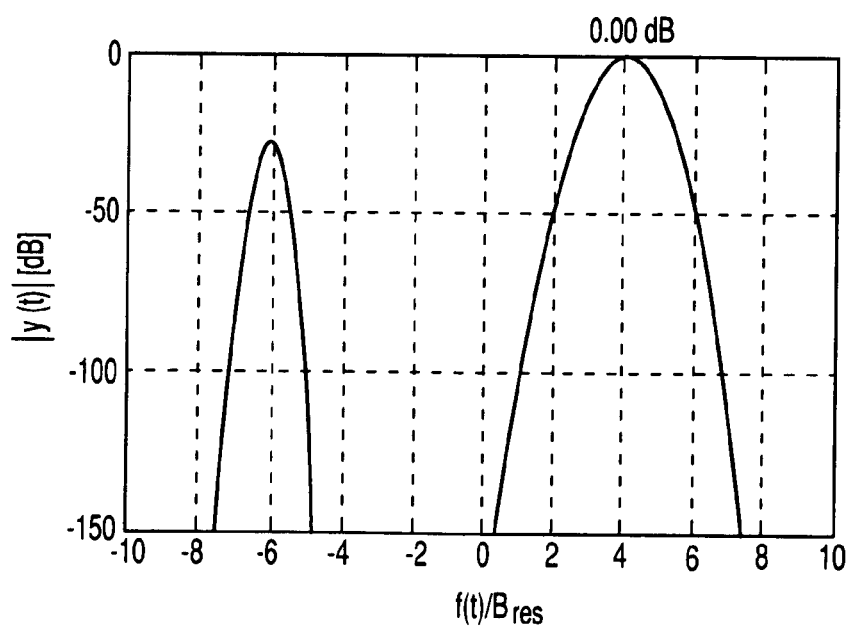
FIG. 5 shows a sweep with a linear-phase filter.

FIG. 3 shows an example of the discrete impulse response h(k) as a function of the sampling index of a minimal-phase Gaussian filter by comparison with a linear-phase Gaussian filter. It is evident that the minimal-phase filter has a substantially shorter group delay response than the linear-phase filter. Of course, the minimal-phase filter has the same number of taps $\text{nof}_{Taps}=161$ as the linear-phase filter, that is to say, the transient time is of the same length. However, during the sweep, the transient error of the minimal-phase filter decays substantially more rapidly than in the case of the linear-phase filter, as can be seen from a comparison of FIG. 4 with FIG. 5. FIG. 4 shows the sweep with a minimal-phase filter, while FIG. 5 shows the same sweep with a linear-phase filter. In each case, the input signal is a discrete spectral line. It is evident that, in the case of the minimal-phase filter, the error has already decayed so severely during the transient phase, i.e. immediately after the "first lobe", that approximately the second half of the transient phase can be used for the analysis. By contrast, with the linear-phase filter, the analysis cannot be started until later.

An improved filter design is achieved with the following method. The linear-phase filter is not designed with $\text{nof}_{Taps}$ taps, but rather with double the length $2 \cdot \text{nof}_{Taps}$. As a target function, $|H_{disp}(f)|^2$ is also specified rather than $|H_{disp}(f)|$. The same applies for any cost functions used. Following this, the zero positions in the circle of unit radius are calculated from the determined digital filter $h_{disp}^{(long)}(k)$. The mirror-image symmetrical zero positions outside the circle of unit radius are rejected. The impulse response $h_{disp}(k)$ generated in this manner has the desired number of taps $\text{nof}_{Taps}$. Moreover, it also has the desired target modulus frequency response $|H_{disp}(f)|$. The filter calculated in this manner has no doubled zero positions, so that this design exploits the full degree of freedom.

3. Calculation of $h_{used}(k)$:

The impulse response $h_{disp}(k)$ is now available. According to equation (11), the impulse response of the filter to be used is calculated using the following equation:

$$h_{used}(k) = h_{disp}(k) \cdot e^{-j\frac{\pi}{K}B_{res}^2(k-k_0)^2 \cdot T_a^2} \text{ with } k = [0, \text{nof}_{Taps} - 1], \quad (16)$$

wherein $T_a$ is the sampling period of the digital filter. By contrast with equation (11), the parameter $k_0$, which brings about a displacement of the spectrum within the spectral range, has been introduced according to the invention. Various desirable effects can be achieved with the parameter $k_0$:

1. Compensation of the frequency overshoot: as a result of the group delay of the resolution filter, the corresponding frequency of the output signal has a similar overshoot. This effect can be compensated by setting an appropriate $k_0$.

2. Minimisation of the required bandwidth of $H_{used}(f)$: with an increasing sweep rate (smaller k), the middle of the spectrum $H_{used}(f)$ is no longer at the frequency origin f=0, but is displaced towards the higher frequencies. With the present digital system, the required sampling rate $f_a$ would therefore have to be unnecessarily increased, in order to continue to fulfil the sampling theorem. This effect can be avoided by an appropriate choice of $k_0$. In a good approximation, $k_0=k_{max}$ should be selected, $k_{max}$ being the time of the maximum of $|h_{disp}(k)|$.

Reference must also be made to a procedure, which is meaningful for the implementation: $h_{used}(k)$ should never be pre-calculated for different sweep rates k and stored in the device; only $h_{disp}(k)$ should be pre-calculated. The relevant impulse response $h_{used}(k)$ will be calculated in the device according to the specifications in equation (16) after the desired sweep rate is known. This method has the advantage that the housekeeping and memory requirement for the individual impulse responses does not occur. Furthermore, the impulse response for the present k is always used. As a result, no quantisation errors occur, because the impulse response $h_{used}(k)$ for the exact k-factor set is not available.

The closed display of the impulse response of the complex resolution filter is determined as follows.

For the derivation of the closed display of the impulse response $h_{used}$ of the filter, the time-continuous case will first be considered. In this case, the free variation parameter is $t_0=k_0 \cdot T_a$.

A Gaussian resolution filter with the bandwidth $B_{res}$ is used for the spectrum analysis. The "displayed" resolution filter should have the following impulse response and transmission function:

$$h_{disp}(t) = \sqrt{\frac{\pi}{2\ln(2)}} B_{res} \cdot e^{-\frac{\pi^2}{2\ln(2)}\left(\frac{t}{T_{res}}\right)^2} * h_{allp}(t) \quad (17)$$

$$H_{disp}(f) = e^{-2\ln(2)\cdot\left(\frac{f}{B_{res}}\right)^2} \cdot e^{j\varphi(f)}$$

The amplitude-corrected display of the spectral lines is secured with $|H_{disp}(f=0)|=1$. The phase characteristic $\varphi(f)$ of the transmission function can be selected randomly, because $|H_{disp}(f)|$ is displayed in the spectrum analysis. The phase response $\varphi(f)$ can be determined, for example, according to the method described above, so that the transmission function is a minimal-phase function, which leads to a rapid transient of $h_{disp}(t)$. The Fourier retransform of $e^{j\varphi(f)}$ is $h_{allp}(t)$. Since a multiplication with $e^{j\varphi(f)}$ is implemented in the frequency domain, a corresponding convolution with the impulse response $h_{allp}(t)$ of an all-pass filter must be implemented in the time domain, which is symbolised by the character *. Because of the correlation indicated in equation (11) between $h_{disp}(t)$ and $h_{used}(t)$, $\varphi(t)$ describes not only the phase response of the transmission function $H_{disp}(f)$, but also the phase response of the transmission function $H_{used}(f)$ of the resolution filter.

The impulse response of the resolution filter to be used is obtained according to equation (16) in a time-continuous display as:

$$h_{used}(t) = h_{disp}(t) \cdot e^{-j\frac{\pi}{K}B_{res}^2(t-t_0)^2}. \quad (18)$$

The following equation is obtained by substitution:

$$h_{used}(t) = \sqrt{\frac{\pi}{2\ln(2)}} B_{res} \cdot \left[e^{-\frac{\pi^2}{2\ln(2)}\left(\frac{t}{T_{res}}\right)^2} * h_{allp}(t)\right] \cdot e^{-j\frac{\pi}{K}B_{res}^2(t-t_0)^2}. \quad (19)$$

The transition to the discrete impulse response follows from:

$$h_{used}(k) = T_a h_{used}(t=kT_a)$$

By substitution of equation (19), the following equation is obtained:

$$h_{used}(k) = \sqrt{\frac{\pi}{2\ln(2)}} \cdot B_{res} \cdot T_a \cdot \quad (20)$$

$$\left[e^{-\frac{\pi^2}{2\ln(2)}\left(\frac{t}{T_{res}}\right)^2} * h_{allp}(t)\right] \cdot e^{-j\frac{\pi}{K}B_{res}^2(t-t_0)^2} \bigg|_{\substack{t_0=k_0 \cdot T_a \\ t=kT_a}}$$

With $T_{res}=1/B_{res}$, $B_{res}$=resolution bandwidth with a 3 dB signal decay relative to the maximum and $T_a$=sampling period in the baseband.

The following general presentation for the impulse response is obtained:

$$h_{used}(k) = C_1 \cdot [e^{-C_2 T_a^2 \cdot k^2} * h_{allp}(t)] \cdot e^{-jC_3(k-k_0)^2 \cdot T_a^2}$$

In this equation, k denotes the sampling index, and $T_a$ denotes the sampling period. $C_1$, $C_2$ and $C_3$ are constants, wherein the value of the constant $C_1$ is preferably:

$$C_1 = \sqrt{\frac{\pi}{2\ln(2)}} \cdot B_{res} \cdot T_a$$

and wherein $B_{res}$ is the bandwidth of the resolution filter.

The value of the constant $C_2$ is preferably:

$$C_2 = \frac{\pi^2}{2\ln(2)} \cdot \frac{1}{T_{res}^2},$$

wherein $T_{res}=1/B_{res}$ is the reciprocal bandwidth $B_{res}$ of the resolution filter.

The value of the constant $C_3$ is preferably $$C_3 = \frac{\pi}{K} \cdot B_{res}^2,$$

wherein $B_{res}$ is the bandwidth of the resolution filter, and K is the k-factor of the resolution filter, which is defined by the equation:

$$f(t) = \frac{1}{K} \cdot B_{res}^2 \cdot t$$

and f(t) is a linear frequency variable with time t, which is supplied to the mixer 3 of the spectrum analyser connected upstream of the resolution filter 4.

However, the constants $C_1$, $C_2$ and $C_3$ may also conceivably be specified in a different manner within the framework of the present invention.

While the present invention has been described in connection with a number of embodiments and implementations, the present invention is not so limited but covers various obvious modifications and equivalent arrangements, which fall within the purview of the appended claims.

What is claimed is:

1. A resolution filter for a spectrum analyser, wherein the resolution filter has the following complex, discrete impulse response $h_{used}(k)$:

$$h_{used}(k) = C_1 \cdot [e^{-C_2 T_a^2 \cdot k^2} * h_{allp}(t)] \cdot e^{-jC_3(k-k_0)^2 \cdot T_a^2}$$

wherein $C_1$, $C_2$ and $C_3$ are constants, k is the sampling index and $T_a$ is the sampling period, wherein $h_{allp}(t)$ is the Fourier retransform of $e^{j\varphi(f)}$, in which $\varphi(f)$ is a randomly-specified phase response dependent upon the frequency of the transmission function of the resolution filter, wherein $k_0$ is a free variation parameter and wherein the variation parameter $k_0$ is set in such a manner that the frequency overshoot determined by the group delay of the resolution filter is compensated.

2. A resolution filter according to claim 1, wherein:

the variation parameter $k_0$ is set in such a manner that the middle of the frequency response $H_{used}(f)$ of the resolution filter is disposed at the frequency origin at the frequency f=0.

3. A resolution filter according to claim 1, wherein:
φ(f) and $h_{allp}(t)$ are selected in such a manner that a minimal-phase resolution filter is formed.

4. A resolution filter according to claim 1, wherein:
the value of the constant $C_1$ is:

$$C_1 = \sqrt{\frac{\pi}{2ln(2)} \cdot B_{res} \cdot T_a}$$

wherein $B_{res}$ is the bandwidth of the resolution filter.

5. A resolution filter according to claim 1, wherein:
the value of the constant $C_2$ is $$C_2 = \frac{\pi^2}{2ln(2)} \cdot \frac{1}{T_{res}^2},$$

wherein $T_{res}=1/B_{res}$ is the reciprocal bandwidth $B_{res}$ of the resolution filter.

6. A resolution filter according to claim 1, wherein:
the value of the constant $C_3$ is $$C_3 = \frac{\pi}{K} \cdot B_{res}^2,$$

wherein $B_{res}$ is the bandwidth of the resolution filter and K is the K-factor of the resolution filter, wherein the K-factor is defined via the equation:

$$f(t) = \frac{1}{K} \cdot B_{res}^2 \cdot t$$

and f(t) is a frequency variable with time t in a linear manner, which is supplied to a mixer of the spectrum analyser connected upstream of the resolution filter.

7. A spectrum analyser for analysing the spectrum of an input signal with a resolution filter specifying the frequency resolution, wherein the resolution filter has the following complex, discrete impulse response $h_{used}(k)$:

$$h_{used}(k) = C_1 \cdot [e^{-C_2 T_a^2 \cdot k^2} * h_{allp}(t)] \cdot e^{-jC_3(k-k_0)^2 \cdot T_a^2}$$

wherein $C_1$, $C_2$ and $C_3$ are constants, k is the sampling index and $T_a$ is the sampling period,
wherein $h_{allp}(t)$ is the Fourier retransform of $e^{j\phi(f)}$, in which φ(f) is a randomly-specified phase response dependent upon the frequency of the transmission function of the resolution filter,
wherein $k_0$ is a free variation parameter and
wherein the variation parameter $k_0$ is set in such a manner that the frequency overshoot determined by the group delay of the resolution filter is compensated.

8. A spectrum analyser according to claim 7, wherein:
the variation parameter $k_0$ is set in such a manner that the middle of the frequency response $H_{used}(f)$ of the resolution filter is disposed at the frequency origin at the frequency f=0.

9. A spectrum analyser according to claim 7, wherein:
φ(f) and $h_{allp}(t)$ are selected in such a manner that a minimal-phase resolution filter is formed.

\* \* \* \* \*